United States Patent
Chang et al.

(10) Patent No.: US 10,163,885 B2
(45) Date of Patent: Dec. 25, 2018

(54) SYSTEMS AND METHODS FOR A SEQUENTIAL SPACER SCHEME

(71) Applicant: Taiwan Semiconductor Manufacturing Company, Ltd., Hsin-Chu (TW)

(72) Inventors: Shih-Ming Chang, Hsin-Chu (TW); Ming-Feng Shieh, Tainan County (TW); Ru-Gun Liu, Hsinchu County (TW); Tsai-Sheng Gau, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/668,930

(22) Filed: Aug. 4, 2017

(65) Prior Publication Data

US 2017/0358566 A1  Dec. 14, 2017

Related U.S. Application Data

(60) Division of application No. 15/173,840, filed on Jun. 6, 2016, now Pat. No. 9,735,140, which is a continuation of application No. 14/262,279, filed on Apr. 25, 2014, now Pat. No. 9,362,132.

(51) Int. Cl.
| | |
|---|---|
| *H01L 27/02* | (2006.01) |
| *H01L 21/768* | (2006.01) |
| *H01L 21/3213* | (2006.01) |
| *H01L 21/033* | (2006.01) |
| *H01L 23/522* | (2006.01) |
| *H01L 21/308* | (2006.01) |
| *H01L 29/06* | (2006.01) |

(52) U.S. Cl.
CPC ...... *H01L 27/0207* (2013.01); *H01L 21/0337* (2013.01); *H01L 21/3086* (2013.01); *H01L 21/3088* (2013.01); *H01L 21/32139* (2013.01); *H01L 21/76816* (2013.01); *H01L 21/76877* (2013.01); *H01L 23/5226* (2013.01); *H01L 29/0657* (2013.01)

(58) Field of Classification Search
CPC ............ H01L 21/3086; H01L 21/3088; H01L 29/0657; H01L 21/0337; H01L 21/0338; H01L 21/31144; H01L 21/32139; H01L 21/3081; H01L 21/0273; H01L 21/32; H01L 27/10844; H01L 21/00; G03F 1/70; G03F 7/11; G03F 7/70466
USPC ....................................... 438/696
See application file for complete search history.

(56) References Cited

U.S. PATENT DOCUMENTS

| | | |
|---|---|---|
| 7,669,173 B2 | 2/2010 | Haffner |
| 8,242,022 B2 | 8/2012 | Kim |
| 2015/0318209 A1 | 11/2015 | Chang et al. |

*Primary Examiner* — Caleen Sullivan
(74) *Attorney, Agent, or Firm* — Haynes and Boone, LLP

(57) ABSTRACT

Semiconductor devices disclosed herein have minimum spacings that correlate with spacer widths. An exemplary semiconductor device includes a substrate and a target layer disposed over the substrate. The target layer includes a first target feature, a second target feature, and a third target feature. The second target feature is spaced a first distance from the first target feature, and the third target feature is spaced a second distance from the first target feature. The first distance corresponds with a first width of a first spacer fabricated during a first spacer patterning process, and the second distance corresponds with a second width of a second spacer fabricated during a second spacer patterning process.

20 Claims, 13 Drawing Sheets

SYSTEMS AND METHODS FOR A SEQUENTIAL SPACER SCHEME

This is a divisional application of U.S. patent application Ser. No. 15/173,840, filed Jun. 6, 2016, now U.S. Pat. No. 9,735,140, which is a continuation of U.S. patent application Ser. No. 14/262,279, filed Apr. 25, 2014, now U.S. Pat. No. 9,362,132, the entire disclosures of which are hereby incorporated by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

BRIEF DESCRIPTION OF THE DRAWINGS

It is emphasized that, in accordance with the standard practice in the industry, various features are not drawn to scale. In fact, the dimensions of the various features may be arbitrarily increased or reduced for clarity of discussion.

Aspects of the figures in the present disclosure are best understood from the following detailed description as read in connection with the figures.

DETAILED DESCRIPTION

It is to be understood that the following disclosure provides many different embodiments, or examples, for implementing different features of the provided subject matter. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features are not in direct contact. Various features may be arbitrarily drawn in different scales for the sake of simplicity and clarity.

In semiconductor device fabrication, the pursuit of smaller feature size has required a number of technological changes, including changes in the fabrication processes uses to create features on a semiconductor wafer. More recently, to mitigate the difficulties presented by the increasingly small features, multiple lithography processes have been applied in patterning a single target layer. For example, a first photolithography step is used in a multiple lithography process to pattern some features according to a desired layout, while a second photolithography step is used to pattern other features according to the same desired layout to be produced in the target layer. Sub-layouts and corresponding submasks may be used to pattern a desired layout in stages. Some such processes may include double-lithography, double-etch (LELE), self-aligned double patterning (SADP) and similar processes. However, such multiple lithography processes have not been entirely satisfactory.

Figure 1:
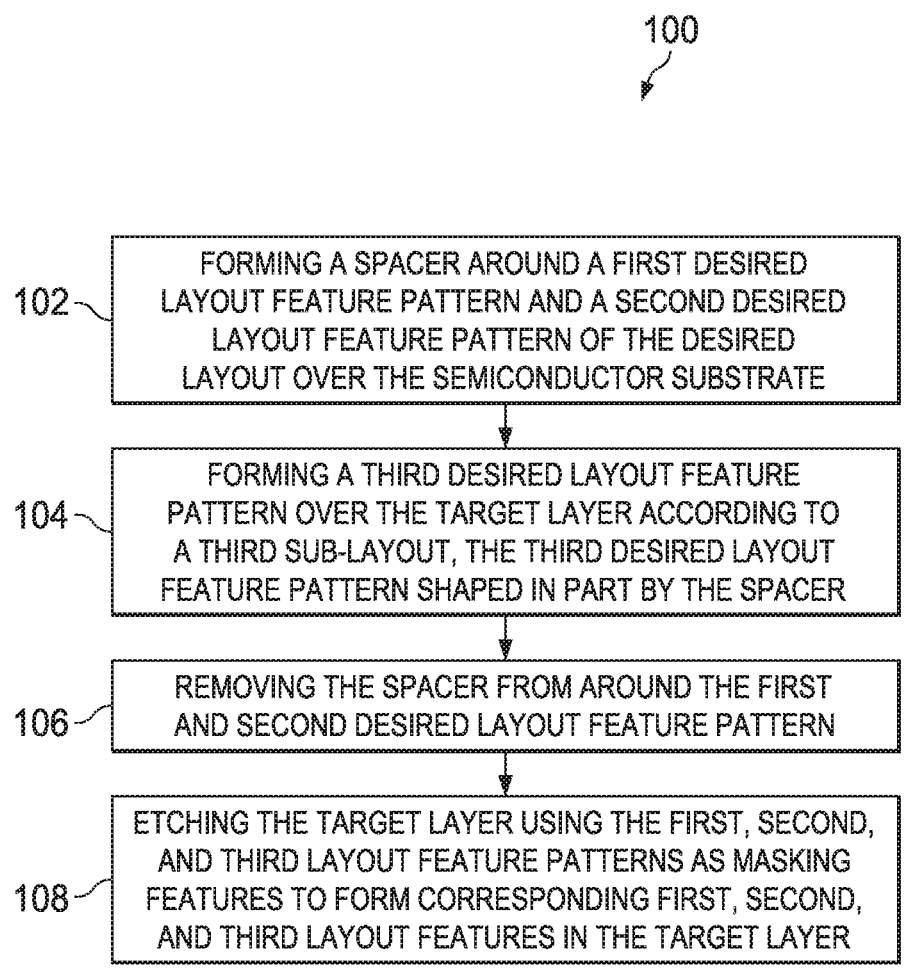
FIG. 1 is a flowchart of a method for transferring a desired layout into a target layer on a semiconductor substrate.

FIG. 1 illustrates a method 100 for transferring a desired layout into a target layer on a semiconductor substrate. As illustrated in FIG. 1, method 100 includes several enumerated steps. However, some embodiments of the method 100 include additional steps before, after, and/or in between the enumerated steps. As illustrated, method 100 begins in step 102 in which a spacer is formed around a first desired layout feature pattern and a second desired layout feature pattern of the desired layout over the semiconductor substrate. The first desired layout feature pattern is formed over the target layer using a first sub-layout and the second desired layout feature pattern is formed over the target layer using a second sub-layout. The first and second desired layout feature patterns are separated by a first distance or width. And the spacer has a second width. In step 104, a third desired layout feature pattern is formed over the target layer according to a third sub-layout. The third desired layout feature pattern is shaped in part by the spacer. In step 106, the spacer is removed from around the first and second desired layout feature pattern. And in step 108, the target layer is etched using the first, second, and third layout feature patterns as masking features to form corresponding first, second, and third layout features in the target layer.

Figure 2A:
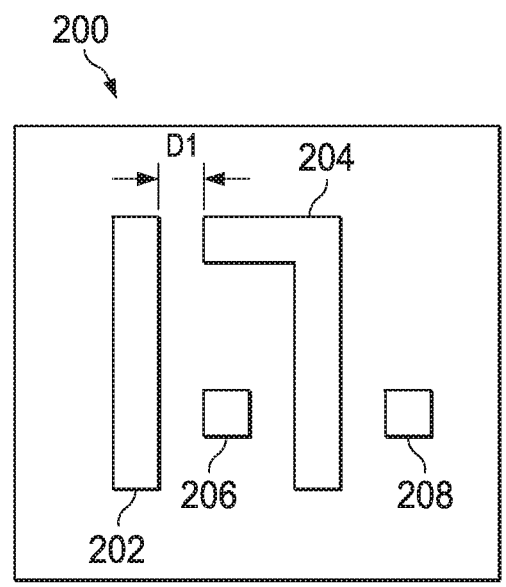
FIGS. 2A and 2B are fragmentary views of a desired layout and the desired layout as decomposed into three sub-layouts.

To more clearly describe at least one embodiment of the method 100 reference is made in discussing steps 102-108 to additional figures, including FIGS. 2A and 2B, 3A-C, 4A-C, 5A-C, 6A-C, 7A-C, 8A-C, 9A-C, 10A-C, 11A-C, and 12A-C. FIG. 2A illustrates a fragmentary view of a desired layout 200 that is to be realized in a target material layer in order to form components, like transistors, resistors, capacitors, and others, of a semiconductor device such as a processor or solid-state memory. Thus, while the desired layout 200 includes only four depicted features, embodiments of the desired layout 200 may include many thousands or millions of such features. As illustrated, the desired layout 200 includes a first desired layout feature 202, a second desired layout feature 204, a third desired layout feature 206, and a fourth desired layout feature 208. A minimum separation distance D1 is provided between at least the first and second desired layout features 202 and 204. For the sake of example, in a 10 nm technology node, D1 would be between about 5 nm and 15 nm. The desired layout 200 is provided as a computer-readable file, such as a GDSII file, or another such file as is known in the art.

Figure 2B:
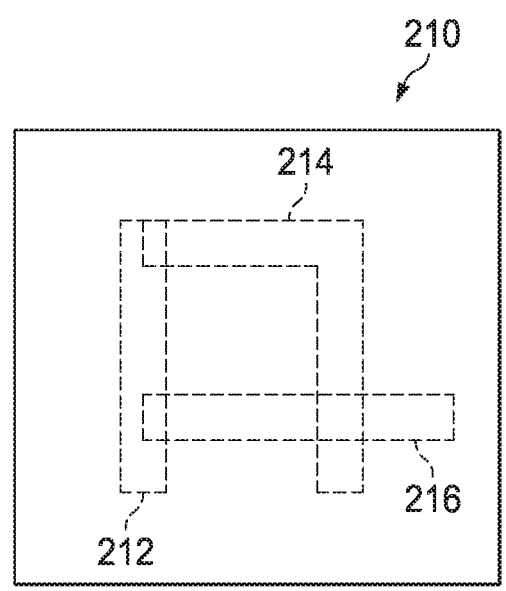

The desired layout 200 may thus be provided to a layout system, which in at least one embodiment is a computer, having one or more processors and memory, running programs to simulate and optimize a desired layout to increase the fidelity with which the desired layout is transferred to a target layer. Thus the layout system may provide for the modification of a desired layout, like the desired layout 200, by altering the geometries of the desired layout features 202, 204, 206, and 208 and/or by including assist features that are not intended to be transferred into a target layer, but that improve the transfer of the desired features. Thus, FIG. 2B illustrates the desired layout 200 after such optimization, including a decomposition process, that results in a decomposed desired layout 210. When the desired layout 200 is decomposed by the layout system, the features 202, 204, 206, and 208 may be assigned to two or more sub-layouts that belong to the decomposed desired layout 210. For example, features 202 and 204 may be assigned to different sub-layouts in addition to being modified to increase the fidelity of transference into the target layer. The sub-layouts are visually overlaid in FIG. 2B to more clearly illustrate the relationship of the decomposed desired layout 210 to the original desired layout 200. As depicted in FIG. 2B, the desired feature 202 is to be generated by a first sub-layout 212, while the second desired feature 204 is to be patterned by a second sub-layout 214. While the first desired feature 202 is not significantly altered by the layout system, an upper portion of the second sub-layout 204 is extended beyond the geometry of the second desired feature 204 order to ensure a proper transfer. As seen in FIG. 2A, layout features 202 and 204 are separated by a distance D1. In order to fabricate the desired separation distance reliably, a spacer process is used during the fabrication of the desired layout 200.

The layout system is aware of the spacer process in a fabrication process flow provided to the layout system. The layout system 100 uses the fabrication process flow to optimize the modification and decomposition of the desired layout 200 into the decomposed desired layout 210. Thus, in forming the sub-layouts 212 and 214, the layout system anticipates the use of a spacer to provide the desired separation distance. As seen in FIG. 2B, the decomposed desired layout 210 includes a third sub-layout 216. In conjunction with a spacer process, the sub-layout 216 is used to pattern the third layout feature 206 as well as the fourth feature 208. In some embodiments, the decomposed desired layout 210 may include additional sub-layouts.

Figure 3A:
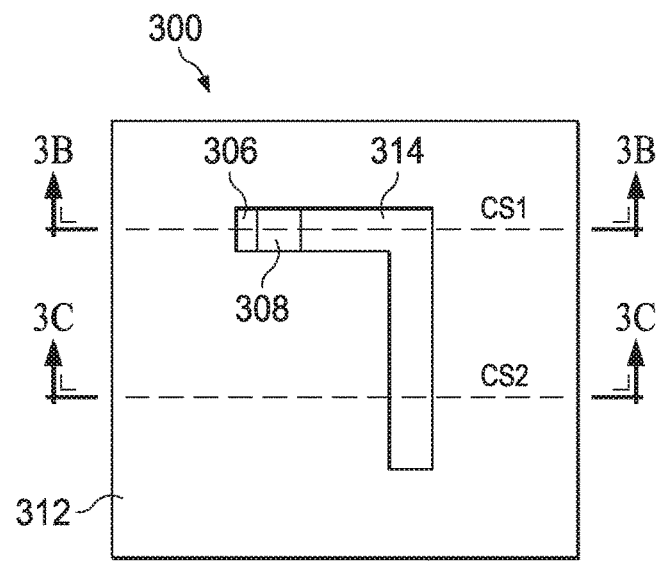
FIGS. 3A, 3B, and 3C are a fragmentary top view and two fragmentary cross-sectional diagrams of a semiconductor wafer during processing according to the flowchart of FIG. 1.
Figure 3B:
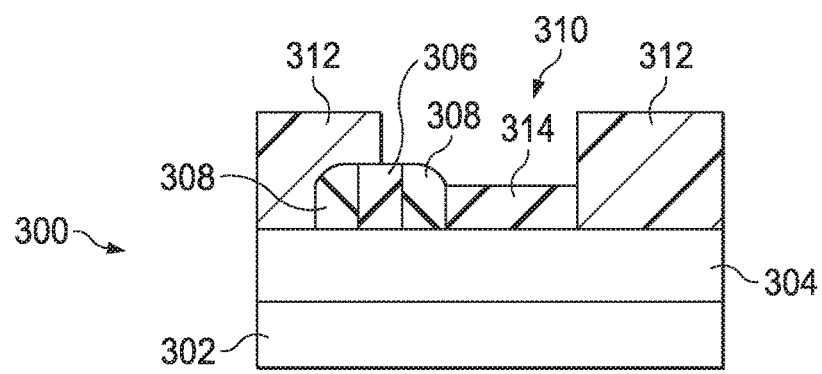
Figure 3C:
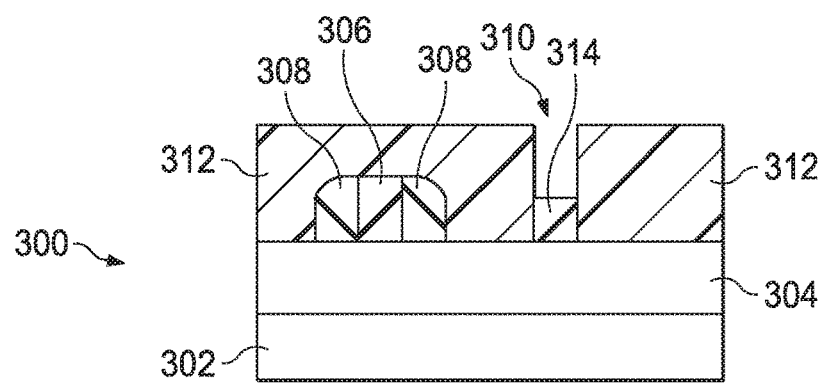

FIG. 3A illustrates a fragmentary top view of a wafer 300 that includes a substrate 302 with a plurality of material layers thereon. The substrate 302 is a silicon substrate, but may be another substrate material such as silicon oxide, silicon carbide, sapphire, or still other substrates. The substrate 302 is better seen in the cross-sectional views provided in FIGS. 3B and 3C. FIG. 3B illustrates the wafer 300 along a cross-sectional line CS1 of FIG. 3A. Similarly, FIG. 3C illustrates the wafer 300 along a cross-sectional line CS2 shown in FIG. 3A. Other cross-sectional views along lines CS1 and CS2 are illustrated in FIGS. 4B-C, 5B-C, 6B-C, 7B-C, 8B-C, 9B-C, 10B-C, 11B-C, and 12B-C and will be described in this disclosure.

As seen in FIGS. 3B and 3C, a target layer 304 is illustrated over the substrate 302. In some embodiments, the target layer 304 is in direct contact with the substrate 302. However, in other embodiments there may be many other layers, including patterned layers, between the target layer 304 and the substrate 302. In the illustrated embodiment, the target layer 304 is a conductive material layer. The target layer 304 may also be formed from copper, aluminum, gold, tungsten, or alloys thereof, or yet other materials.

Over the target layer 304, there is a first desired layout feature pattern 306. The first desired layout feature pattern 306 is formed using the sub-layout 212 as seen in FIG. 2B and discussed herein. Additionally, a spacer 308 is illustrated around or surrounding the feature pattern 306. The feature pattern 306 is formed from a patterned layer of an organic polymer. In some embodiments, the organic polymer of the feature pattern 306 is a silicon-containing polymer. And the spacer 308 is formed from silicon oxide, silicon nitride, titanium nitride, or other appropriate materials. Other materials may be used in different embodiments of the wafer 300 for the feature pattern 306 and the spacer 308. A trench 310 is formed in an intermediate layer 312, which is a photoresist layer as illustrated. A lower region of the trench is filled with a plug feature 314, which is disposed over the target layer 304. The plug feature 314 is an embodiment of the second desired layout feature pattern described in step 102 of method 100. The plug feature 314 is formed by a process that includes depositing a plug material layer over the wafer 300. The plug material layer is deposited or spun on in contact with the target layer 304, the feature pattern 306, and the spacer 308 as exposed by the trench 310, and over the intermediate layer 312. The plug material layer is etched back, removing material from over the intermediate layer 312, the feature pattern 306, and the spacer 308, but leaving a portion of the plug material layer that forms the plug feature 314.

Figure 4A:
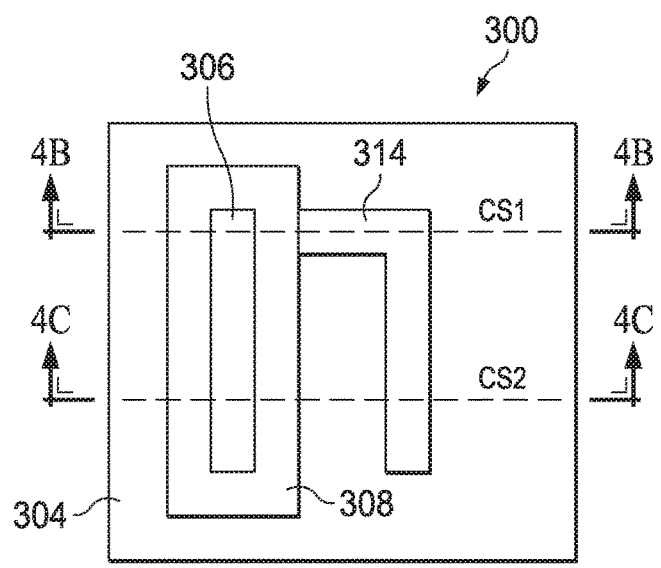
FIGS. 4A, 4B, and 4C are a fragmentary top view and two fragmentary cross-sectional diagrams of a semiconductor wafer during processing according to the flowchart of FIG. 1.
Figure 4B:
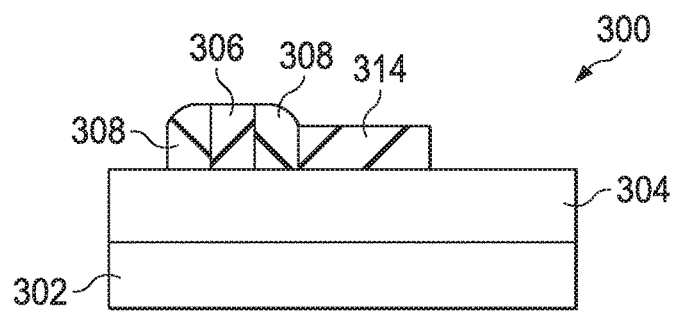
Figure 4C:
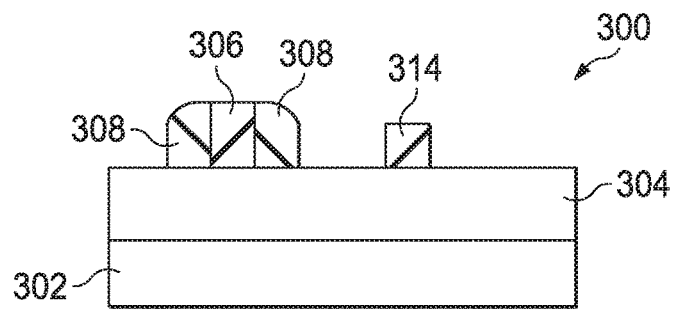

Referring now to FIGS. 4A, 4B, and 4C, the intermediate layer 312 is removed from the target layer 304, the feature pattern 306, the spacer 308. FIGS. 4B and 4C are cross-sectional illustrations taken along lines CS1 and CS2 of FIG. 4A. The plug feature 314, protrudes from the surface of the target layer 304 with its sidewalls exposed where not in contact with the spacer 308.

Figure 5A:
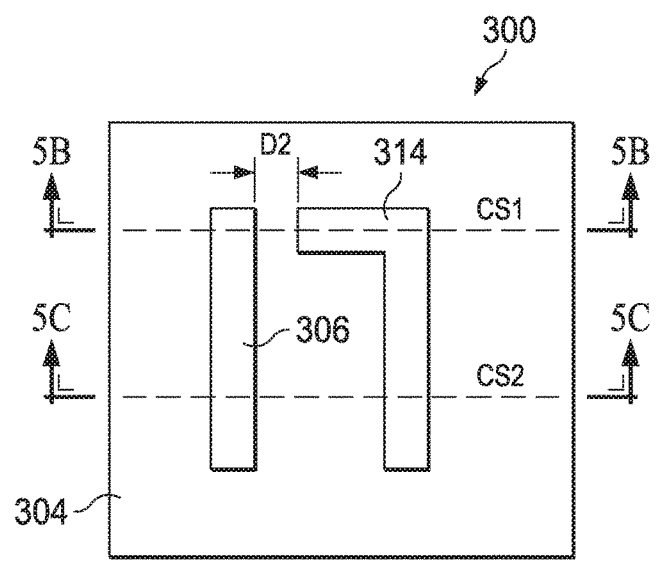
FIGS. 5A, 5B, and 5C are a fragmentary top view and two fragmentary cross-sectional diagrams of a semiconductor wafer during processing according to the flowchart of FIG. 1.
Figure 5B:
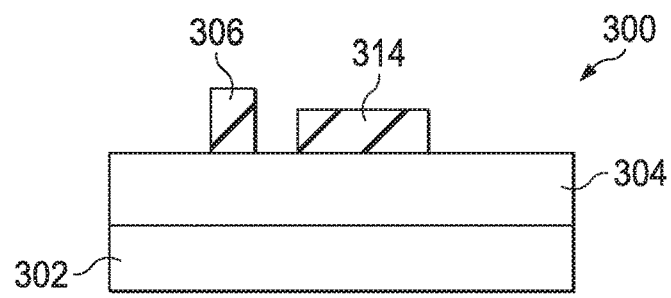
Figure 5C:
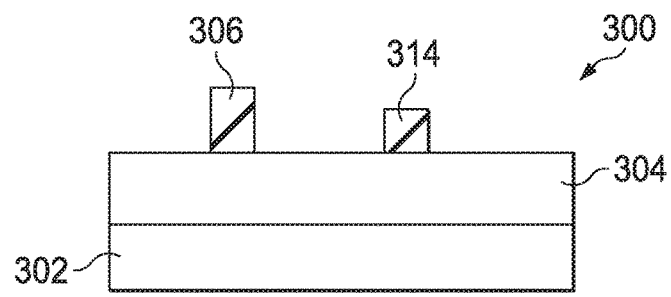

Referring now to FIGS. 5A, 5B, and 5C, the spacer 308 is removed from around the feature pattern 306 and from off of the target layer 304. FIGS. 5B and 5C are cross-sectional illustrations taken along lines CS1 and CS2 of FIG. 5A. As seen in in top in FIG. 5A, the feature pattern 306 corresponds to the first sub-layout 212 and the first desired feature 202 of FIGS. 2B and 2A, respectively. The geometry of the plug feature 314 corresponds to the second desired layout feature 204 of FIG. 2, and is produced using the trench 310 of FIGS. 3A-C, which corresponds to the second sub-layout 214. As illustrated in FIGS. 5A and 5B, the feature pattern 306 and the plug feature 314 are separated by a distance D2. The distance D2 is the same as the distance D1, illustrated in the desired layout 200 of FIG. 2A. Also, the distance D2 is provided by, and is equal to, the width of the spacer 308. The width of the spacer 308 may be determined by the functions of the features to formed in the target layer 304 by using the feature pattern 306 and the plug feature 314.

Figure 6A:
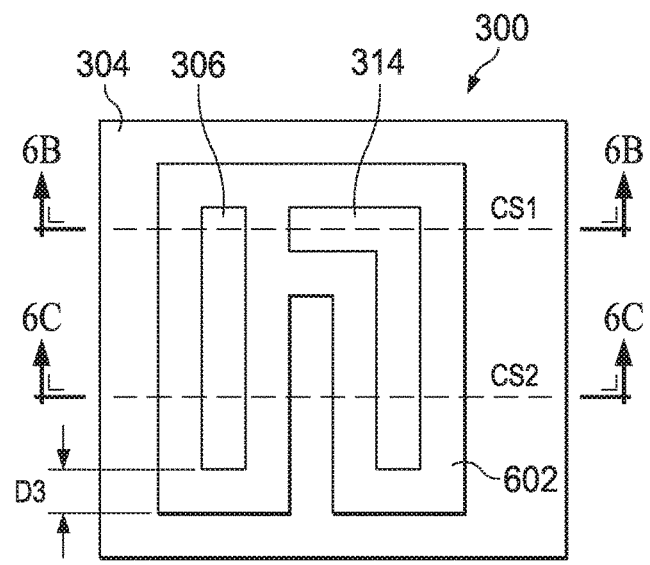
FIGS. 6A, 6B, and 6C are a fragmentary top view and two fragmentary cross-sectional diagrams of a semiconductor wafer during processing according to the flowchart of FIG. 1.
Figure 6B:
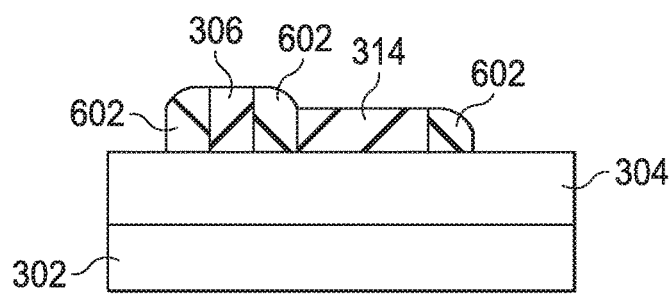
Figure 6C:
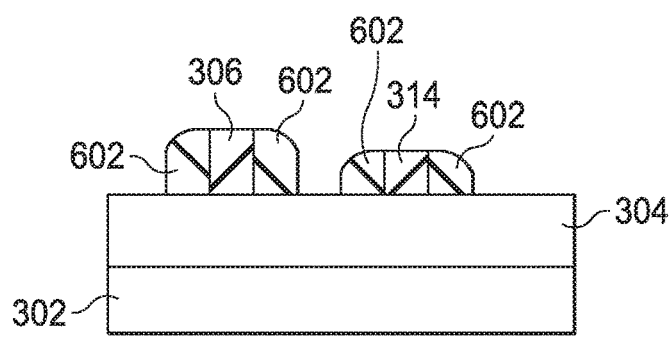

Referring now to FIGS. 6A, 6B, and 6C, a second spacer, spacer 602, is formed around both the feature pattern 306 and the plug feature 314, over the target layer 304. The formation of the spacer 602 is an embodiment of the step 102 of the method 100, illustrated in FIG. 1 and described herein. The spacer 308 as seen in FIGS. 4A-C had a first width D2, which provided the minimum separation distance between the feature pattern 306 and the plug feature 314. For the sake of example, in a 10 nm technology node, D2 would be between about 5 nm and 15 nm. As included in the method 100, the first and second desired layout feature patterns are separated by a first distance or width. The spacer 602 has a width D3, as illustrated in FIG. 6A. In some embodiments, the width D3 is less than the width of the spacer 308 (D2). In other embodiments, the width of the spacer 602 is greater than the width of the spacer 308. In such embodiments, separation distance between the feature pattern 306 and the plug feature 314 remains unchanged.

Figure 7A:
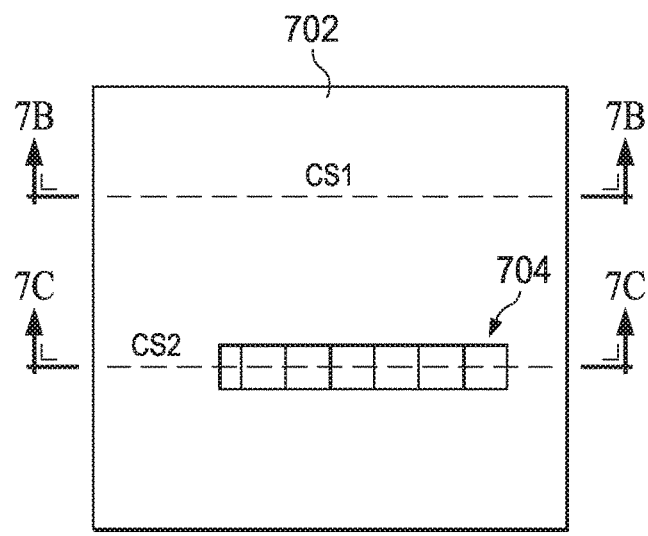
FIGS. 7A, 7B, and 7C are a fragmentary top view and two fragmentary cross-sectional diagrams of a semiconductor wafer during processing according to the flowchart of FIG. 1.
Figure 7B:
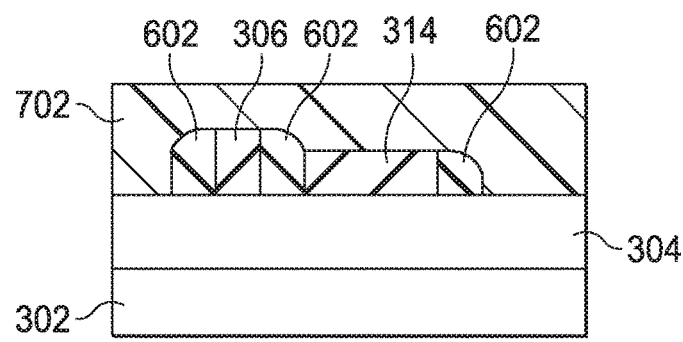
Figure 7C:
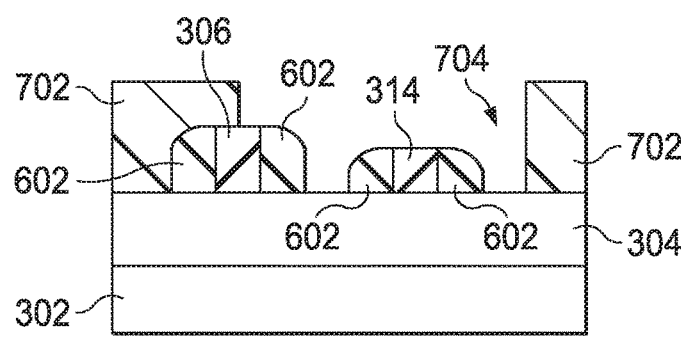

Referring now to FIGS. 7A, 7B, and 7C, the wafer 300 is shown therein having an additional intermediate layer 702 deposited over the features of the wafer 300 as seen in FIGS. 7A-C. The intermediate layer 702 may be a photoresist layer or another sacrificial layer. A trench 704 is formed in the intermediate layer 702 that exposes a portion of the pattern feature 306, the spacer 602, the target layer 304, and the plug feature 314. The trench 702 corresponds to the third sub-layout 216 as illustrated in FIG. 2B. The trench 702 may be formed by a development step in a photolithographic process, by electron beam direct writing, or by an etching process. The opening provided by the trench 704 is clearly depicted in FIG. 7C.

Figure 8A:
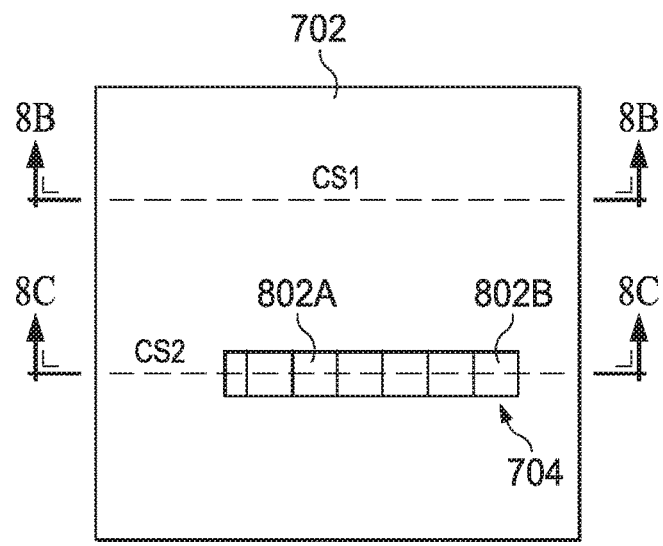
FIGS. 8A, 8B, and 8C are a fragmentary top view and two fragmentary cross-sectional diagrams of a semiconductor wafer during processing according to the flowchart of FIG. 1.
Figure 8B:
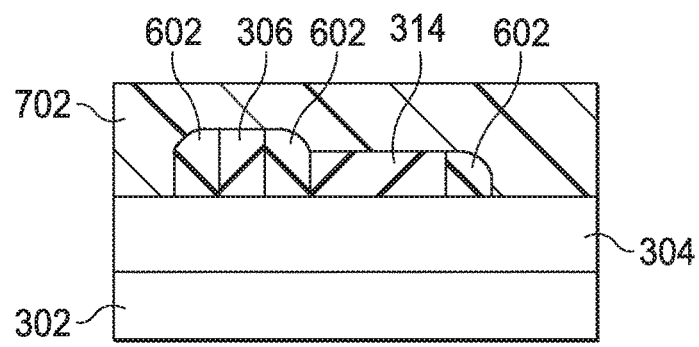
Figure 8C:
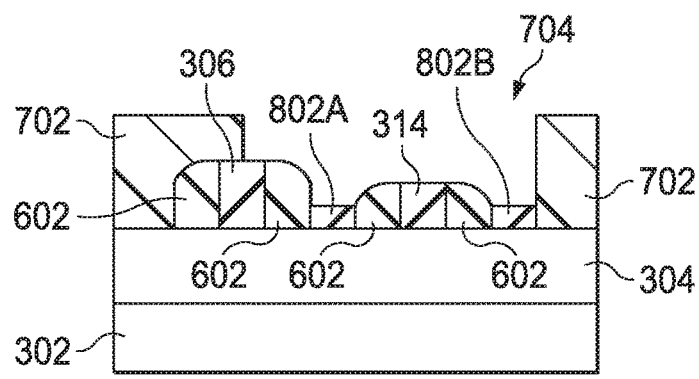

Referring now to FIGS. 8A, 8B, and 8C, an embodiment of the third desired layout feature pattern of step 104 of method 100 is shown therein. As seen in top view in FIG. 8A, plug features 802A and 802B are formed within the trench 704. The plug features 802A and 802B correspond to the third desired layout feature 206 and the fourth desired layout feature 208 as seen in the desired layout 200 of FIG. 2A. The plug features 802A and 802B are formed by depositing a plug material layer over the wafer 300, filling the trench 704. An etch back process removes the portions of the plug layer from over the intermediate layer 702 and from portions within the trench 704 that are above the feature pattern 306, the spacer 602, and the plug feature 314. In some embodiments, the plug feature 314 and the plug features 802A and 802B are formed from the same material. For example, the plug features 314, 802A, and 802B are formed from a silicon-containing polymer in some embodiments. However, in other embodiments, the plug feature 802A and 802B are formed from a different material than that of the plug feature 314.

Figure 9A:
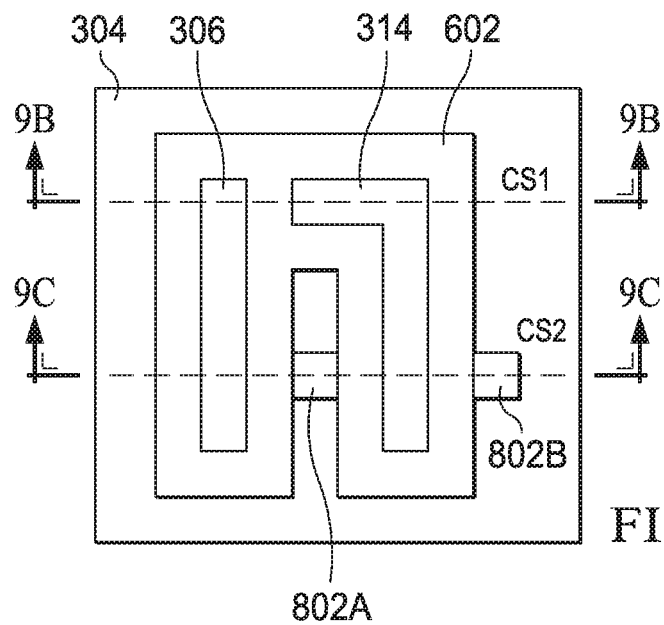
FIGS. 9A, 9B, and 9C are a fragmentary top view and two fragmentary cross-sectional diagrams of a semiconductor wafer during processing according to the flowchart of FIG. 1.
Figure 9B:
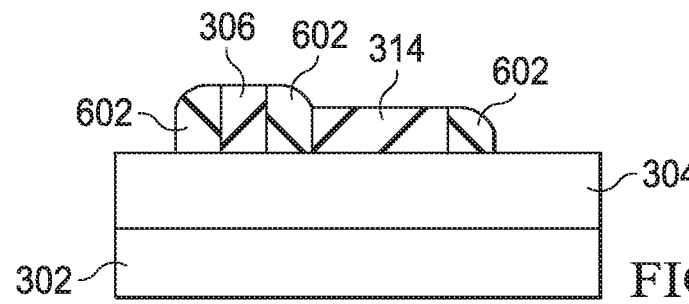
Figure 9C:
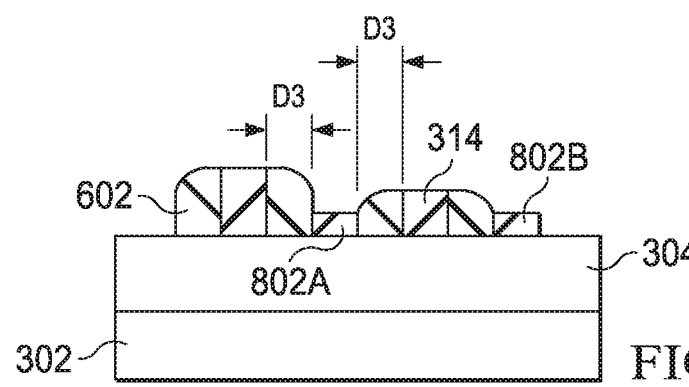

FIGS. 9A, 9B, and 9C illustrate the wafer 300 after the removal of the intermediate layer 702. As in seen in FIG. 9C, the plug feature 802A is separated from the feature pattern 306 and the plug feature 314, by a width of the spacer 602. Thus, the spacer 602 and the trench 704 are used to define the geometry of the plug features 802A and 802B.

Figure 10A:
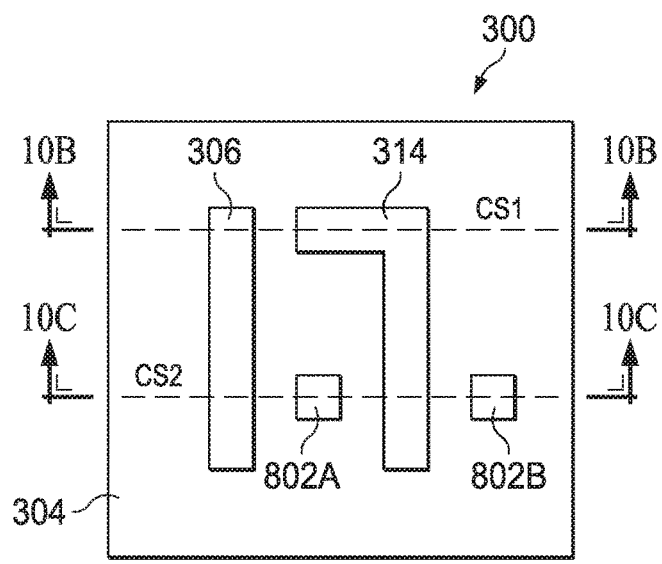
FIGS. 10A, 10B, and 10C are a fragmentary top view and two fragmentary cross-sectional diagrams of a semiconductor wafer during processing according to the flowchart of FIG. 1.
Figure 10B:
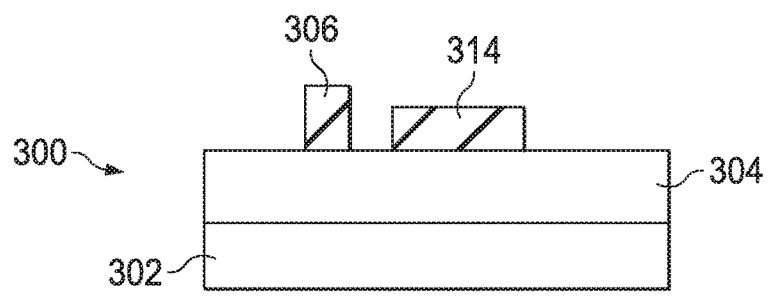
Figure 10C:
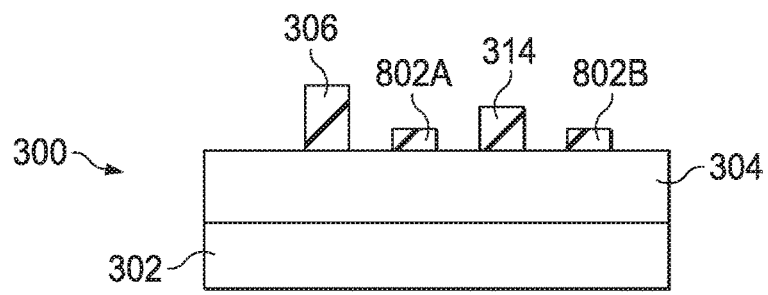

Referring now to FIGS. 10A, 10B, and 10C, FIG. 10A illustrates the wafer 300 in top view during processing, while FIGS. 10B and 10C illustrate the wafer 300 in cross-section along lines CS1 and CS2, respectively. As seen in FIGS. 10A-C, the spacer 602 is removed from around the pattern feature 306 and the plug feature 314 by an etching process. In some embodiments, the etching process is a wet etch, but in others a dry etch process is used. Thus, the result of step 106 of method 100 may be better understood by reference to FIGS. 10A-C.

Figure 11A:
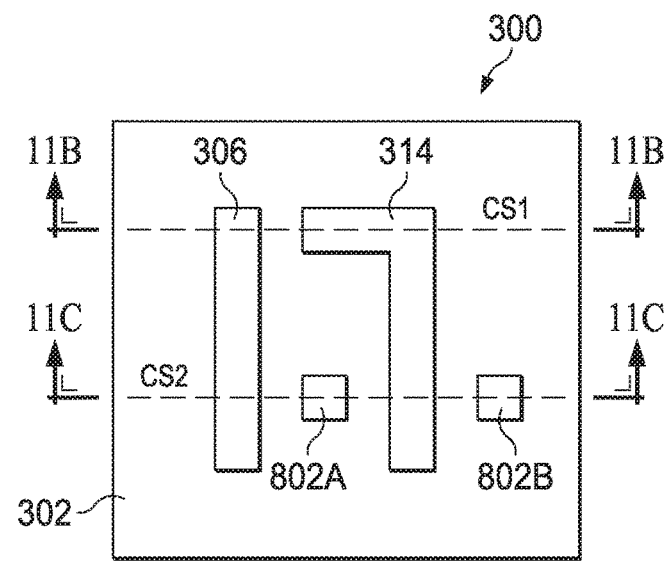
FIGS. 11A, 11B, and 11C are a fragmentary top view and two fragmentary cross-sectional diagrams of a semiconductor wafer during processing according to the flowchart of FIG. 1.
Figure 11B:
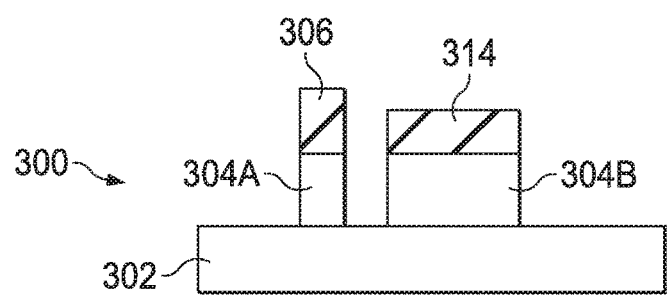
Figure 11C:
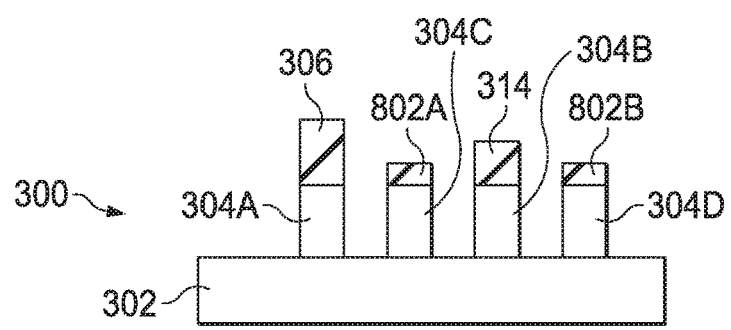

Referring now to FIGS. 11A, 11B, and 11C, the patterning of the target layer 304 is illustrated. As in step 108 of the method 100, an etch process is used to etch the target layer 304 to transfer the pattern feature 306, the plug feature 314 and the plug features 802A and 802B into the target layer. The feature pattern 306, the plug feature 314, and the plug features 802A and 802B are used as masking features during an etching process. In the top view of FIG. 11A, only the substrate 302, or the layer or layers below the target layer 304 in other embodiments, the pattern feature 306, the plug feature 314, and the plug features 802A and 802B are seen. In the cross-sectional views provided along lines CS1 and CS2, seen in FIGS. 11B and 11C, respectively, the remaining, patterned portions of the target layer 304 are illustrated. The patterned portions of the target layer 304 include a first target layer feature 304A, a second target layer feature 304B, and third and fourth target layer features 304C and 304D, respectively. Etch process is a dry etch process in the illustrated embodiment. However, in some other embodiments a wet etch is used.

Figure 12A:
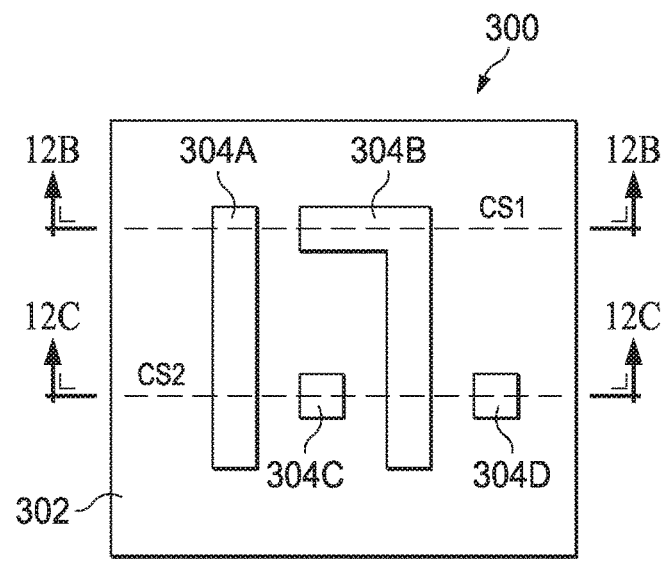
FIGS. 12A, 12B, and 12C are a fragmentary top view and two fragmentary cross-sectional diagrams of a semiconductor wafer during processing according to the flowchart of FIG. 1.
Figure 12B:
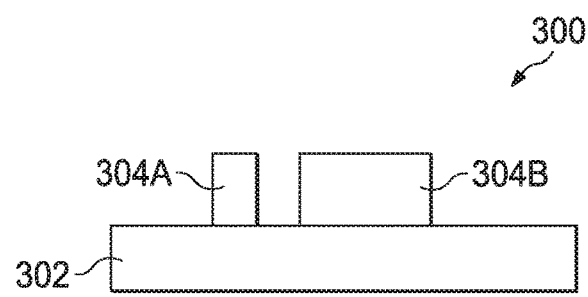
Figure 12C:
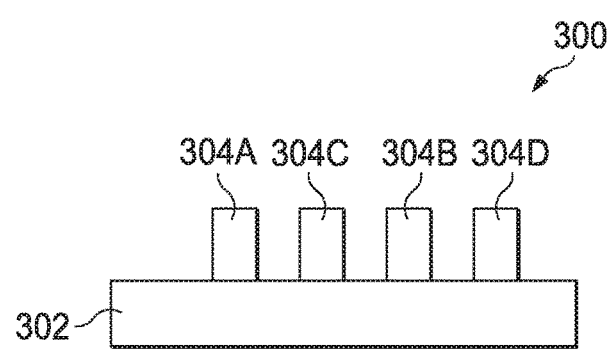

Referring now to FIGS. 12A, 12B, and 12C, the desired layout 200 of FIG. 2A is realized in the target layer 304 in features 304A-D. Thereafter, the pattern feature 306, the plug feature 314, and the plug features 802A and 802B are removed from off of the features 304A-D. In the illustrated embodiment, more than one etch step is used to remove the pattern features. A single etch process is used to remove the pattern feature 306, and a second etch process is used to remove the plug features 314, 802A, and 802B. In other embodiments, a single etch process is used to remove the pattern feature 306 and the plug features 314, 802A, and 802B.

Figure 13:
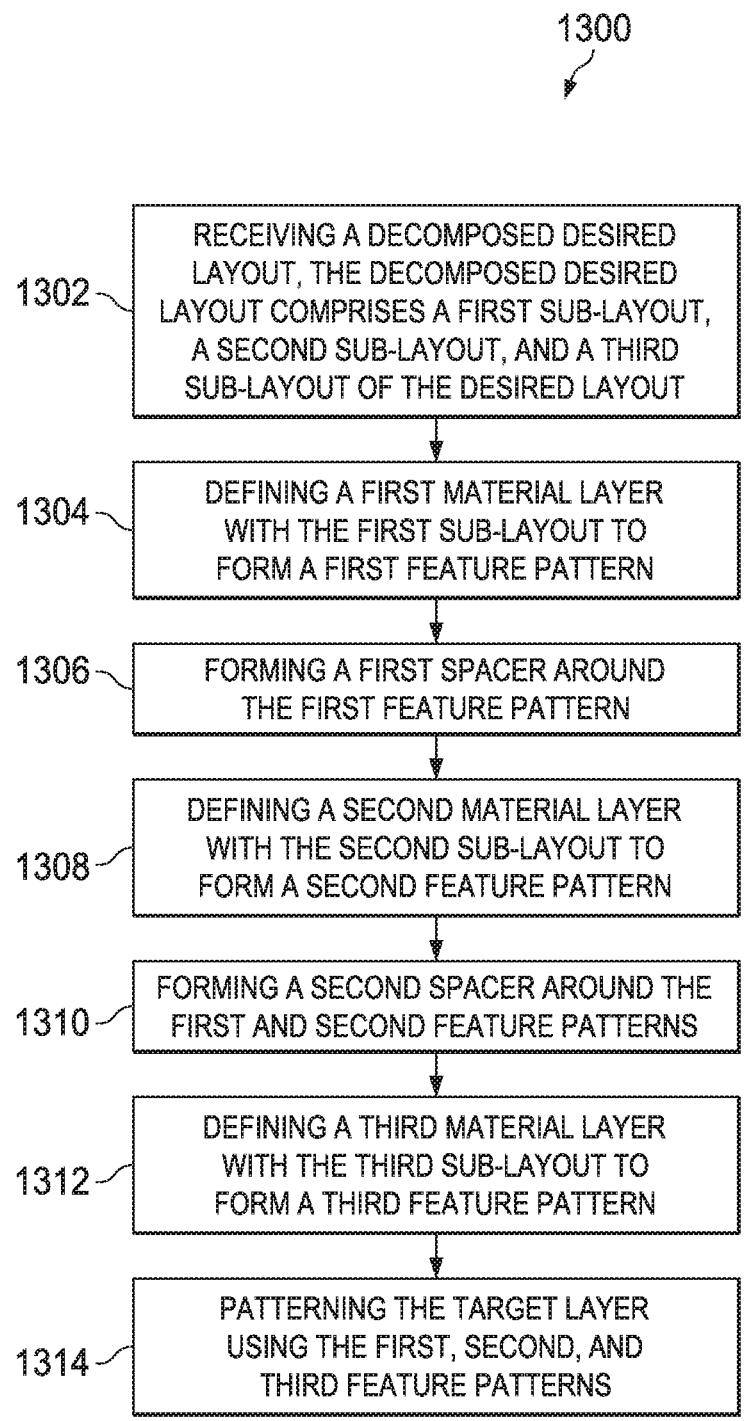
FIG. 13 is a flowchart of a method for transferring a desired layout into a target layer on a semiconductor substrate.

As seen in FIGS. 3A-C, 4A-C, 5A-C, 6A-C, 7A-C, 8A-C, 9A-C, 10A-C, 11A-C, and 12A-C, the sub-layouts 212, 214, and 216 of the decomposed desired layout 210 are used to pattern the desired layout 200 into the target layer 304. Minimum desired spacings are provided by a sequence of the spacers 308 and 602. In some embodiments, spacer 308 and 602 have the same width, while in others their widths are different. Additionally, some embodiments of the method 100 of FIG. 1, may include forming additional desired layout feature patterns and patterning them into the target layer 304. For example, when a fourth sub-layout is desired or required, a third spacer may be deposited around all of the features patterned earlier and a trench is formed and filled to provide the features of the fourth sub-layout. The patterns may be transferred by forming and filling trenches as described herein. Thus, more complicated desired layouts may be decomposed into more sub-layouts and patterned as described herein. Because the separation between features is provided Referring now to FIG. 13, a flowchart of a method 1300 for forming a desired layout in a target layer is illustrated. As illustrated, the method 1300 includes several enumerated steps. Embodiments of the method 1300 may include additional steps before, after, in between, and/or as part of the enumerated steps. As illustrated, method 1300 begins in step 1302 in which a decomposed desired layout is received. The decomposed layout may be similar to the decomposed desired layout 210 as illustrated in FIG. 2B. The decomposed desired layout 210 includes a first sub-layout, a second sub-layout, and a third sub-layout that can be combined to produce a desired layout. In step 1304, a first material layer is defined with the first sub-layout to form a first feature pattern, and in step 1306, a first spacer is formed around the first feature pattern.

In step 1308, a second a second material layer is defined with the second sub-layout to form a second feature pattern. The first and second feature patterns being separated by at least a width of the first spacer. This may be seen in FIGS. 3A-C, in which a trench 310 is patterned into an intermediate layer 312. The trench 310 is filled to form a second feature pattern, shown in FIGS. 3A-C as the plug feature 314. After the trench 310 is filled, the intermediate layer 312 may be removed as seen in FIGS. 4A-C, thereby exposing the first spacer. In step 1309, the first spacer 308 may then be removed from around the feature pattern 306 by an etch processes, such as a wet etch process, as seen in FIGS. 5A-C. In some embodiments, the first spacer 308 may be thinned by etching rather than be removed entirely.

In step 1310, a second spacer is formed around the first and second feature patterns. An embodiment of the second spacer is illustrated in FIGS. 6A-C, which show the spacer 602, which surrounds both the feature pattern 306 and the plug feature 314. In step 1312, a third material layer is defined with the third sub-layout to form a third feature pattern that is separated from the first and second feature patterns by at a width of the second spacer. FIGS. 7A-C and 8A-C illustrate an embodiment of the step 1312. As illustrated, an intermediate layer 702 is deposited and an opening or trench 704 is formed therein. Two plug features 802A and 802B are formed within the trench 704 on the exposed portions of the target layer 304 therein. In step 1313, the intermediate layer 702 is removed and the second spacer 602 is removed as depicted in FIGS. 9A-C. In some embodiments, the second spacer 602 is not entirely removed, but is thinned by an etch process instead.

In step 1314, the target layer is patterned using the first, second, and third feature patterns. Referring to FIGS. 10A-C and 11A-C, the feature pattern 306, the plug feature 314, and the plug features 802A and 802B are used as masking features in an etch process to remove the exposed portions of the target layer 304, resulting in the desired layout as seen in FIGS. 12A-C.

The methods and structures described above may facilitate the reproduction of complex patterns of increasingly small features by facilitating the decomposition of a desired layout into realizable sub-layouts. Minimum spacing is reliably maintained between all of the features formed from each of the sub-layouts by using a sequence of spacers. In one embodiment, this is achieved by using and removing spacers to form a feature layout with which to pattern another layer.

In one exemplary aspect, the present disclosure describes a method for transferring a desired layout into a target layer on a semiconductor substrate. The method includes a step of forming a spacer around a first desired layout feature pattern and a second desired layout feature pattern of the desired layout over the semiconductor substrate. The first desired layout feature pattern is formed over the target layer using a first sub-layout and the second desired layout feature pattern is formed over the target layer using a second sub-layout. The first and second desired layout feature patterns are separated by a first width and the spacer has a second width. The method further includes a step of forming a third desired layout feature pattern over the target layer according to a third sub-layout. The third desired layout feature pattern is shaped in part by the spacer. The method further includes steps of removing the spacer from around the first and second desired layout feature pattern and of etching the target layer using the first, second, and third layout feature patterns as masking features to form corresponding first, second, and third layout features in the target layer.

In another exemplary aspect, another method for transferring a desired layout into a target layer on a semiconductor substrate is disclosed herein. The method includes steps of receiving a decomposed desired layout that has a first sub-layout, a second sub-layout, and a third sub-layout of the desired layout, defining a first material layer with the first sub-layout to form a first feature pattern, and forming a first spacer around the first feature pattern. The method further includes steps of defining a second material layer with the second sub-layout to form a second feature pattern separated from the first feature pattern by at least a width of the first spacer, forming a second spacer around the first and second feature patterns, and defining a third material layer with the third sub-layout to form a third feature pattern. The third feature pattern is separated from the first and second feature patterns by at a width of the second spacer. Additionally, the method includes a step of patterning the target layer using the first, second, and third feature patterns.

In an additional exemplary aspect, a semiconductor wafer is disclosed herein. The semiconductor wafer includes a top surface and a bottom surface, a target material layer over the substrate, and a desired layout formed over and in contact with the target material layer. The desired layout includes a first desired layout feature pattern, a second desired layout feature pattern, and a third desired layout feature pattern, with each feature pattern being formed from a different sub-layout of the desired layout. The third desired layout feature pattern is separated from the first and second desired layout feature patterns by a minimum spacing.

The embodiments presented by the top view and cross-sectional view figures described above are not exhaustive. Some processes discuss in any given embodiment may be performed in different orders or have additional processes between the steps. For example, one etch process may be used to remove multiple layers even where more than one is discussed. Thus, the examples provided above are exemplary. They are not intended to be limiting. One skilled in the art may readily devise other systems and methods consistent with the disclosed embodiments. These other systems and methods are intended to be within the scope of this disclosure. As such, the disclosure is limited only by the following claims.

What is claimed is:

1. A semiconductor device comprising:
   a substrate; and
   a target layer disposed over the substrate, wherein the target layer includes:
   a first target feature,
   a second target feature spaced a first distance from the first target feature, wherein the first distance corresponds with a first width of a first spacer fabricated during a first spacer patterning process, and
   a third target feature spaced a second distance from the first target feature and a third distance from the second target feature, wherein the second distance corresponds with a second width of a second spacer fabricated during a second spacer patterning process, and further wherein the third distance corresponds with a third width of a third spacer formed during the second spacer patterning process.

2. The semiconductor device of claim 1, wherein the first width is the same as the second width, such that the first distance is the same as the second distance.

3. The semiconductor device of claim 1, wherein the first width is different than the second width, such that the first distance is different than the second distance.

4. The semiconductor device of claim 1, wherein the third width of the third spacer is the same as the second width of the second spacer.

5. The semiconductor device of claim 1, wherein the target layer further includes a fourth target feature spaced a fourth distance from the second target feature, wherein the fourth distance corresponds with a fourth spacer formed during the second spacer patterning process.

6. The semiconductor device of claim 1, wherein the first distance is a minimum spacing specified for a particular technology node.

7. The semiconductor device of claim 1, wherein the second distance is a minimum spacing specified for a particular technology node.

8. A semiconductor device comprising:
a first patterned layer disposed over a substrate;
a second patterned layer disposed over the substrate, wherein a first minimum spacing between the first patterned layer and the second patterned layer is defined by a first spacer fabricated during a first spacer patterning process; and
a third patterned layer disposed over the substrate, wherein a second minimum spacing between the first patterned layer and the third patterned layer is defined by a second spacer fabricated during a second spacer patterning process and further wherein a third minimum spacing between the second patterned layer and the first patterned layer is defined by a third spacer fabricated during the second spacer patterning process.

9. The semiconductor device of claim 8, wherein the first minimum spacing is the same as a width of the first spacer.

10. The semiconductor device of claim 8, wherein the second minimum spacing is the same as a width of the second spacer.

11. The semiconductor device of claim 8, wherein the first minimum spacing and the second minimum spacing are the same.

12. The semiconductor device of claim 8, wherein the first minimum spacing is not adjacent to the second minimum spacing.

13. The semiconductor device of claim 8, wherein the first patterned layer, the second patterned layer, and the third patterned layer include conductive materials.

14. The semiconductor device of claim 8, wherein the first minimum spacing, the second minimum spacing, and the third minimum spacing are about 5 nm to about 15 nm.

15. The semiconductor device of claim 8, wherein the second minimum spacing and the third minimum spacing are the same.

16. A semiconductor device comprising:
a target material layer disposed over a substrate and patterned by a desired layout, wherein the desired layout includes:
a first desired layout feature pattern, a second desired layout feature pattern, and a third desired layout feature pattern, each feature pattern being formed from a different sub-layout of the desired layout,
wherein the third desired layout feature pattern is separated from the first desired layout feature pattern by a first minimum spacing and from the second desired layout feature pattern by a second minimum spacing, and
wherein the desired layout further includes a fourth desired layout feature pattern being formed from the same sub-layout of the desired layout as the third desired layout feature pattern.

17. The semiconductor device of claim 16, wherein the target material layer includes material only between the substrate and the desired layout.

18. The semiconductor device of claim 16, wherein the first desired layout feature pattern is formed from a first material that is different from a second material from which the second desired layout feature pattern and the third desired layout feature pattern are formed.

19. The semiconductor device of claim 16, wherein the fourth desired layout feature pattern is also separated from the second desired layout feature pattern by the second minimum spacing.

20. The semiconductor device of claim 16, wherein the first minimum spacing is defined by a width of a first spacer and the second minimum spacing defined by a width of a second spacer.

* * * * *